(12) United States Patent
Jiang et al.

(10) Patent No.: US 11,595,051 B2
(45) Date of Patent: Feb. 28, 2023

(54) FREQUENCY DIVIDING CIRCUIT, FREQUENCY DIVIDING METHOD AND PHASE LOCKED LOOP

(71) Applicant: MAXIO Technology (Hangzhou) Co., Ltd., Hangzhou (CN)

(72) Inventors: Tengxiao Jiang, Hangzhou (CN); Zhiyu Zhuang, Hangzhou (CN); Yiren Huang, Hangzhou (CN)

(73) Assignee: MAXIO TECHNOLOGY (HANGZHOU) CO., LTD., Hangzhou (CN)

( * ) Notice: Subject to any disclaimer, the term of this patent is extended or adjusted under 35 U.S.C. 154(b) by 0 days.

(21) Appl. No.: 17/708,944

(22) Filed: Mar. 30, 2022

(65) Prior Publication Data
US 2022/0321134 A1    Oct. 6, 2022

(30) Foreign Application Priority Data
Mar. 30, 2021    (CN) .......................... 202110340731.0

(51) Int. Cl.
*H03L 7/197*    (2006.01)
*H03L 7/081*    (2006.01)
(Continued)

(52) U.S. Cl.
CPC ............ *H03L 7/1974* (2013.01); *H03L 7/081* (2013.01); *H03L 7/0891* (2013.01); *H03L 7/093* (2013.01)

(58) Field of Classification Search
CPC ..... H03L 7/1974; H03L 7/081; H03L 7/0891; H03L 7/093
See application file for complete search history.

(56) References Cited

U.S. PATENT DOCUMENTS 5,483,203 A * 1/1996 Rottinghaus ......... H03C 3/0933
331/25
8,537,956 B1 * 9/2013 Pham ...................... H04J 3/047
375/376

(Continued)

FOREIGN PATENT DOCUMENTS

CN    113098506 A  *  7/2021  ............. H03L 7/099
CN    113098506 B  *  6/2022  ............. H03L 7/099
(Continued)

*Primary Examiner* — Adam D Houston
(74) *Attorney, Agent, or Firm* — Westman, Champlin & Koehler, P.A.

(57) ABSTRACT

Disclosed is a frequency dividing circuit, a frequency dividing method and a phase locked loop. The frequency dividing circuit comprises: a clock selection unit outputting a first clock signal, select a second clock signal lagging behind the first clock signal by ($\frac{1}{2}$-1/M) of one phase; an integer frequency dividing unit performing frequency division on the first clock signal to provide a frequency-divided clock signal; a trigger unit triggering the frequency-divided clock signal according to the second clock signal to obtain a modulation clock signal; a switching signal unit providing a switching signal according to the modulation clock signal and a preset target output frequency. The clock selection unit selects and further outputs a third clock signal as the first clock signal according to the target phase selection information, to adjust the frequency of the frequency-divided clock signal, reduce noise and improve loop bandwidth of the phase locked loop.

10 Claims, 6 Drawing Sheets

(51) Int. Cl.
*H03L 7/089* (2006.01)
*H03L 7/093* (2006.01)

(56) References Cited

U.S. PATENT DOCUMENTS

| | | | |
|---|---|---|---|
| 9,008,261 B2* | 4/2015 | Xiu | H03K 23/667 |
| | | | 377/47 |
| 10,291,242 B1* | 5/2019 | Elbadry | H03L 7/099 |
| 11,025,260 B1* | 6/2021 | Chao | H03L 7/093 |
| 11,356,107 B1* | 6/2022 | Bhat | H03L 7/093 |
| 2004/0008805 A1* | 1/2004 | Xiu | H03L 7/0996 |
| | | | 375/376 |
| 2007/0041486 A1* | 2/2007 | Shin | H03L 7/18 |
| | | | 375/376 |
| 2010/0164562 A1* | 7/2010 | Tseng | G06F 1/08 |
| | | | 327/156 |
| 2022/0149849 A1* | 5/2022 | Lin | H03L 7/081 |
| 2022/0321134 A1* | 10/2022 | Jiang | H03L 7/081 |

FOREIGN PATENT DOCUMENTS

KR 20120026160 A * 3/2012
KR 101709942 B1 * 2/2017

* cited by examiner

… (5) …

FREQUENCY DIVIDING CIRCUIT, FREQUENCY DIVIDING METHOD AND PHASE LOCKED LOOP

CROSS-REFERENCES TO RELATED APPLICATION

This application claims priority to Chinese Application No. 202110340731.0, filed on Mar. 30, 2021, entitled "frequency dividing circuit, frequency dividing method and phase locked loop", published as CN113098506A on Jul. 9, 2021, the entire contents of which are incorporated herein by reference in their entirety.

FIELD OF THE DISCLOSURE

The present disclosure relates to a technical field of electronic circuits, in particular to a frequency dividing circuit, a frequency dividing method and a phase locking loop.

DESCRIPTION OF THE RELATED ART

With the development of wireless communication technology, phase locked loops have been widely used in various types of wireless communication devices. A phase locked loop (PLL) is a circuit that maintains stable signal frequency in a wireless transmitting/receiving process. The phase locked loop refers to a loop that locks phase, and is a typical feedback control circuit widely used in receivers in communication systems. The phase locked loop has a function to process received signals and extract phase information of a certain clock based on the received signals, that is, to control the frequency and the phase of an internal oscillation signal of the loop by use of an external input reference signal, so as to make a frequency of an input signal automatically tracked by a frequency of an output signal.

For example, as shown in FIG. 1, a phase locked loop 100 is configured to provide a clock signal with one or more frequencies in a chip system. The phase locked loop mainly comprises a phase detector (PD) 110 (or a phase frequency detector, PFD), a charge pump (CP) 120, a low-pass filter (LPF) 130, a voltage-controlled oscillator (VCO) 140, and a frequency divider (DIV) 150. The phase detector 110 is configured to receive a feedback clock signal clk_div' which is output by the phase locked loop 100, and perform phase comparison between the feedback clock signal clk_div' and an input reference clock with frequency fret, thereby generating two phase error signals, which are used to control current inflow and outflow of the charge pump 120 to the low-pass filter 130, so as to adjust an output voltage of the low-pass filter 130. The output voltage of the low-pass filter 130 serves as an input control voltage of the voltage-controlled oscillator 140, and is configured to change the frequency of the clock signal output by the voltage-controlled oscillator 140. Then, the integer frequency divider 150 performs frequency division on the clock signal output from the voltage-controlled oscillator 140 to generate the feedback clock which is input to the phase detector 110, thereby the control signal output from the phase detector 110 can be adjusted. Such cycling is repeated until stable phase locking is achieved, the locally generated reference clock signal has a frequency $f_{ref}'$ which is equal to a frequency $f_{out}'$ of the output clock signal output from the voltage-controlled oscillator 110, or the frequency $f_{ref}'$ is N times higher than the frequency $f_{out}'$, that is, phases of the output voltage and the input voltage is locked.

In many application scenarios of the phase locked loop, a loop bandwidth of phase locked loop is a key parameter. Specifically, the loop bandwidth of the phase locked loop is equal to an integral of its close-loop frequency response, which reflects noise suppression effect of the loop. The smaller the noise bandwidth, the narrower the loop bandwidth, the stronger the suppression ability of the loop to the input noise. Conventional phase locked loops still have problems of excessive noise and narrow bandwidth.

SUMMARY OF THE DISCLOSURE

In view of this, an objective of the present disclosure is to provide a frequency dividing circuit, a frequency dividing method and a phase locked loop, to reduce noise of the frequency dividing circuit, thereby increasing loop bandwidth of the phase locked loop.

According to a first aspect of the present disclosure, there is provided a frequency dividing circuit, configured to provide a frequency-divided clock signal according to a plurality of clock signals, wherein the plurality of clock signals comprises M clock signals, M is an integer greater than 2, and a phase difference between each two adjacent ones of the M clock signals is 1/M of one phase, the frequency dividing circuit comprises:

a clock selection unit, configured to output any one of the M clock signals as a first clock signal and output a clock signal selected from the M clock signals that lags behind the first clock signal by (½-1/M) of one phase as a second clock signal;

an integer frequency dividing unit configured to generate the frequency-divided clock signal by performing frequency division on the first clock signal;

a trigger unit, configured to trigger the frequency-divided clock signal according to the second clock signal to obtain a modulation clock signal so as to synchronize a switching edge of the modulation clock signal with a switching edge of the second clock signal;

a switch signal unit, configured to supply a switching signal to the clock selection unit in accordance with the modulation clock signal and a preset target output frequency, wherein a switching edge of the switching signal is synchronized with a switching edge of the modulation clock signal and the switching signal includes target phase selection information;

the clock selection unit, configured to select a third clock signal different from said any one of the M clock signals and further output the third clock signal as the first clock signal since a switching edge of the switching signal according to the target phase selection information, thereby adjusting a frequency of the frequency-divided clock signal.

Optionally, the clock selection unit comprises:

a first multiplexer, configured to output said any one of the M clock signals as the first clock signal, select the third clock signal from the M clock signals and further output the third clock signal as the first clock signal since a switching edge of the switching signal according to the target phase selection information in case that the switching signal is received;

a second multiplexer, configured to output the clock signal selected from the M clock signals that lags behind the first clock signal by (½-1/M) of one phase as the second clock signal.

Optionally, the trigger unit comprises a first flip-flop configured to trigger the frequency-divided clock signal according to the second clock signal to obtain the modulation clock signal, wherein, a frequency of the modulation clock signal is consistent with the frequency of the frequency-divided clock signal.

Optionally, the switching signal unit comprises a modulator configured to obtain the target phase selection information according to the preset target output frequency and one-to-one correspondence relations between target output frequency values and sets of register values provided in a pre-stored look-up table, wherein, each of the sets of register values comprises phase selection information.

Optionally, the switching signal unit further comprises:

a second flip-flop, configured to convert the switching signal into a first switching signal and a second switching signal according to the modulation clock signal, wherein the first switching signal has an opposite phase to the second switching signal;

a third flip-flop, configured to trigger the first switching signal and the second switching signal according to the second clock signal, wherein the first switching signal and the second switching signal are provided to the first multiplexer to adjust a state of the first clock signal, and the first switching signal and the second switching signal are provided to the second multiplexer to adjust a state of the second clock signal.

Optionally, the clock selection unit further comprises a delayer, through which the plurality of clock signals are coupled to the first multiplexer, wherein the delayer is configured to produce delay on the plurality of clock signals.

Optionally, the switching signal comprises a plurality of switching cycles, the third clock signal selected by the clock selection unit in each one of the plurality of switching cycles is not identical, such that an average cycle of the first clock signal during the plurality of switching cycles is not an integer multiple of ($T_{clk\_vco}$/M) where $T_{clk\_vco}$ represents a clock cycle of the plurality of clock signals.

According to a second aspect of the present disclosure, there is provided a frequency dividing method for providing a frequency-divided clock signal according to a plurality of clock signals, the plurality of clock signals comprises M clock signals, M is an integer greater than 2, and a phase difference between adjacent ones of the M clock signals is 1/M of one phase, wherein the frequency dividing method comprises:

outputting any one of the M clock signals as a first clock signal, and outputting a clock signal selected from the M clock signals that lags behind the first clock signal by (½-1/M) of one phase as a second clock signal;

performing frequency division on the first clock signal to generate the frequency-divided clock signal;

triggering the frequency-divided clock signal according to the second clock signal to obtain a modulation clock signal, so as to synchronize a switching edge of the modulation clock signal with a switching edge of the second clock signal;

providing a switching signal according to the modulation clock signal and a preset target output frequency, wherein edges of the switching signal is synchronized with a switching edge of the modulation clock signal, and the switching signal includes target phase selection information;

selecting a third clock signal different from said any one of the M clock signals and further outputting the third clock signal as the first clock signal since a switching edge of the switching signal according to the target phase selection information, so as to adjust a frequency of the frequency-divided clock signal.

Optionally, the step of providing the switching signal based on the modulation clock signal and the preset target output frequency comprises:

obtaining the target phase selection information according to the preset target output frequency and the one-to-one correspondence relations between target output frequency values and sets of register values provided in a pre-stored look-up table, and providing a switching signal including the target phase selection information, wherein each of the sets of register values includes phase selection information.

According to a third aspect of the present disclosure, there is provided a phase locked loop comprising: a phase detector, configured to compare a reference clock signal with a frequency-divided clock signal to generate a phase error signal; a charge pump and a low-pass filter, wherein current inflow and outflow of the charge pump to the low-pass filter is controlled by the phase error signal, so as to adjust an output voltage of the low-pass filter; a voltage-controlled oscillator configured to generate an output clock signal according to the output voltage; and the above-described frequency dividing circuit configured to perform frequency division on the output clock signal to obtain the frequency-divided clock signal.

According to the frequency dividing circuit, the frequency dividing method and the phase locked loop provided by the present disclosure, the frequency dividing circuit has a function of phase selection, a step width of frequency division is reduced to 1/M, and frequency adjustment is achieved based on a switching edge of the first clock signal, that is, the frequency of the frequency-divided clock signal is adjusted with the step width equal to 1/M of one cycle, such segmented adjustment can reduce quantization noise, thus widening the bandwidth of the phase locked loop, which brings many advantages. For example, the bandwidth of the phase locked loop can be increased, which may speed up the locking time of the phase locked loop and reduce phase noise near the frequency of the output signal of the voltage-controlled oscillator; area requirement on filter can be easily satisfied, that is, the area of the filter can be made smaller, so that the area occupied by the phase locked loop can be reduced.

Furthermore, the frequency dividing circuit or the frequency dividing method can realize fractional frequency division based on different phase selection in different switching cycles, and the fractional frequency dividing method may realize low noise and high precision.

BRIEF DESCRIPTION OF THE DRAWINGS

The above and other objects, advantages and features of the present invention will become more fully understood from the detailed description given hereinbelow in connection with the appended drawings, and wherein.

LIST OF REFERENCE SYMBOLS

Figure 1:
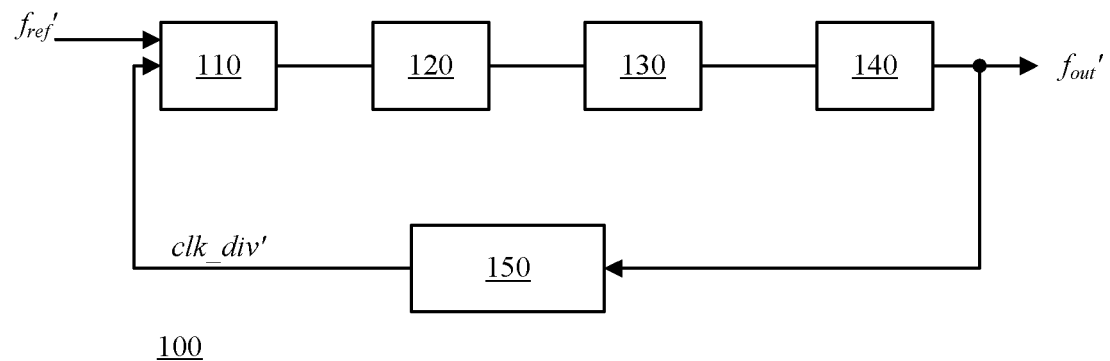
FIG. 1 shows a schematic diagram of a conventional phase locked loop.

100, 200 phase locked loop
110, 210 phase detector
120, 220 charge pump
130, 230 low-pass filter
140, 240 voltage-controlled oscillator
150 integer frequency divider
250 frequency dividing circuit
251 first multiplexer
252 second multiplexer
253 integer frequency divider
254 first flip-flop
255 second flip-flop
256 third flip-flop
257 modulator
258 delayer
261 clock selection unit
262 integer frequency dividing unit
263 trigger unit
264 switching signal unit

DETAILED DESCRIPTION OF EMBODIMENTS OF THE DISCLOSURE

The present disclosure will be described in more detail below with reference to the accompanying drawings. Throughout the figures, like elements are denoted by like reference symbols. For the sake of clarity, portions shown in the figures are not drawn to scale. In addition, some well-known portions may not be shown in the figures.

Hereinafter many specific details of the present disclosure, such as structures, materials, dimensions, processing processes and techniques of a device, are described in order to make the present disclosure clearly understood. However, as will be understood by those skilled in the art, the present disclosure may be practiced without these specific details.

It should be understood that, in the description of embodiments of the preset disclosure, connecting/coupling A with B means that A and B may be connected in series or in parallel, or A and B may be connected through other element, which is not limited by the embodiments of the present disclosure.

The frequency dividing circuit, the frequency dividing method and the phase locked loop provided by the present disclosure can be applied to a transmitting end or a receiving end of various communication systems, such as a radar equipment, a communication equipment, a navigation equipment, a satellite ground stations, an electronic countermeasures equipment and the like. The communication systems are, for example, but are not limited to: global system of mobile communication (GSM) systems, code division multiple access (CDMA) systems, wideband code division multiple access (WCDMA) systems, general packet radio service (GPRS) systems, long term evolution (LTE) systems, LTE frequency division duplex (FDD) systems, LTE time division duplex (TDD) systems, and universal mobile telecommunications systems (UMTS), worldwide interoperability for microwave access (WMAX) communication systems, wireless local area network (WLAN) systems, fifth generation wireless communication systems, etc.

A phase locked loop has a main function of processing a received signal and extract phase information of a clock from the received signal, that is, controlling a frequency and a phase of an internal oscillation signal of the PLL by use of a reference signal which is an external input, so as to make input signal frequency automatically tracked by output signal frequency. However, with the development of wireless communication systems such as 5G, more and more electronic devices are required to support higher frequency and wider frequency range, so the market puts forward higher requirements for operating bandwidth of the phase locked loop.

A frequency dividing circuit in the phase locked loop provided by embodiments of the present disclosure has a phase selection function, so that quantization noise of the frequency dividing circuit can be reduced, thereby broadening the bandwidth of the phase locked loop and improving the efficiency and the operating bandwidth.

Embodiments of a power amplifier provided herein will be described below with reference to the accompanying drawings.

Figure 2:
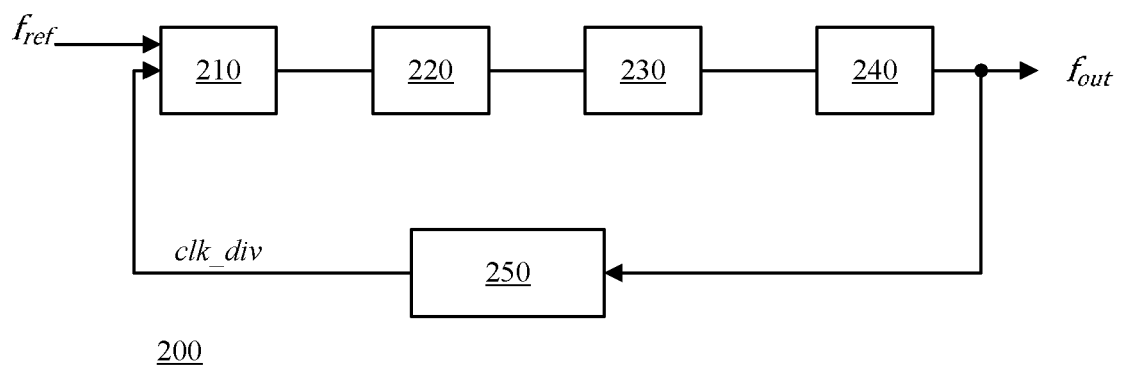
FIG. 2 shows a schematic diagram of a phase locked loop according to an embodiment of the present disclosure.

FIG. 2 shows a schematic diagram of a phase locked loop according to an embodiment of the present disclosure.

As shown in FIG. 2, a phase locked loop 200 provided by an embodiment of the present disclosure comprises a phase detector 210, a charge pump 220, a low-pass filter 230, a voltage-controlled oscillator 240, and a frequency dividing circuit 250. The phase locked loop 200 may specifically be realized by a spread-frequency phase locked loop circuit that controls an output signal to have a target output frequency and remain stable.

Portions of the phase locked loop 200 form a loop having an input terminal and an output terminal, wherein the input terminal is configured to receive a reference clock signal with frequency $f_{ref}$ and the output terminal is configured to provide an output clock signal with frequency $f_{out}$. Specifically, the phase detector 210 has a first input terminal which serves as the input terminal of phase locked loop 200 and configured to receive a reference clock signal with frequency $f_{ref}$, and a second input terminal configured to receive a frequency-divided clock signal clk_div through the frequency dividing circuit 250 which is configured to generate the frequency-divided clock signal clk_div by performing frequency division on an output clock signal. The phase detector 210 is configured to compare the reference clock signal with frequency $f_{ref}$ with the frequency-divided clock signal clk_div, thereby generating phase error signals UP and DN (not shown), and send the two phase error signals to the charge pump 220, which is coupled to the low-pass filter 230. The two phase error signals generated by the phase detector 210 are used to control the current inflow and outflow of the charge pump 220 to the low-pass filter 230, thereby adjusting an output voltage VC of the low-pass filter 230, which serves as a control voltage to be input to the voltage-controlled oscillator 240 and is used for changing the frequency $f_{out}$ of the output clock signal output by the voltage-controlled oscillator 240. Then, the frequency dividing circuit 250 is configured to perform frequency division on the output clock signal with frequency $f_{out}$ output from the voltage-controlled oscillator 240 to obtain a frequency-divided clock signal clk_div having a target frequency. The frequency-divided clock signal clk_div is input to the phase detector 210 as a feedback signal, configured to adjust the control signal (i.e., the two phase error signals) output by the phase detector 210. Such cycle is repeated until stable phase locking is achieved, the frequency $f_{ref}$ of the locally generated reference clock signal is equal to or in a multiple (may be integral and/or fractional) relation with the frequency $f_{out}$ of the clock signal output by the voltage-controlled oscillator 240, that is, the phase of the output signal and the input signal is locked, and the output signal has the target output frequency.

In the embodiments of the present disclosure, the frequency dividing circuit 250 has a phase selection function, and is configured to reduce the step width of frequency division to 1/M of one cycle, and achieve frequency adjustment by use of phase selection, so that the target output frequency is allowed to include arbitrary fractional portion. The state of the frequency-divided clock signal clk_div is adjusted with the step width which is 1/M of one cycle. Such segmented adjustment can reduce quantization noise and thereby widen the bandwidth of the phase locked loop 200. Specific configuration and frequency division principle of the frequency dividing circuit 250 can be referred to FIGS. 3 to 7, and will not be described in detail here.

Figure 3:
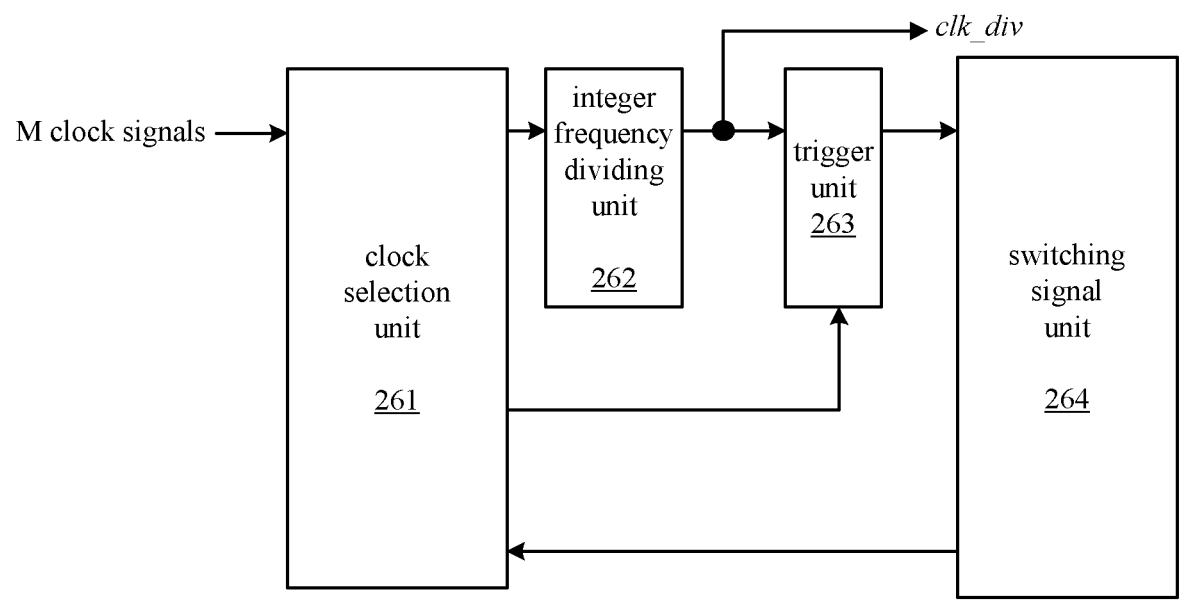
FIG. 3 shows a schematic diagram of a frequency dividing circuit according to a first embodiment of the present disclosure.
Figure 4:
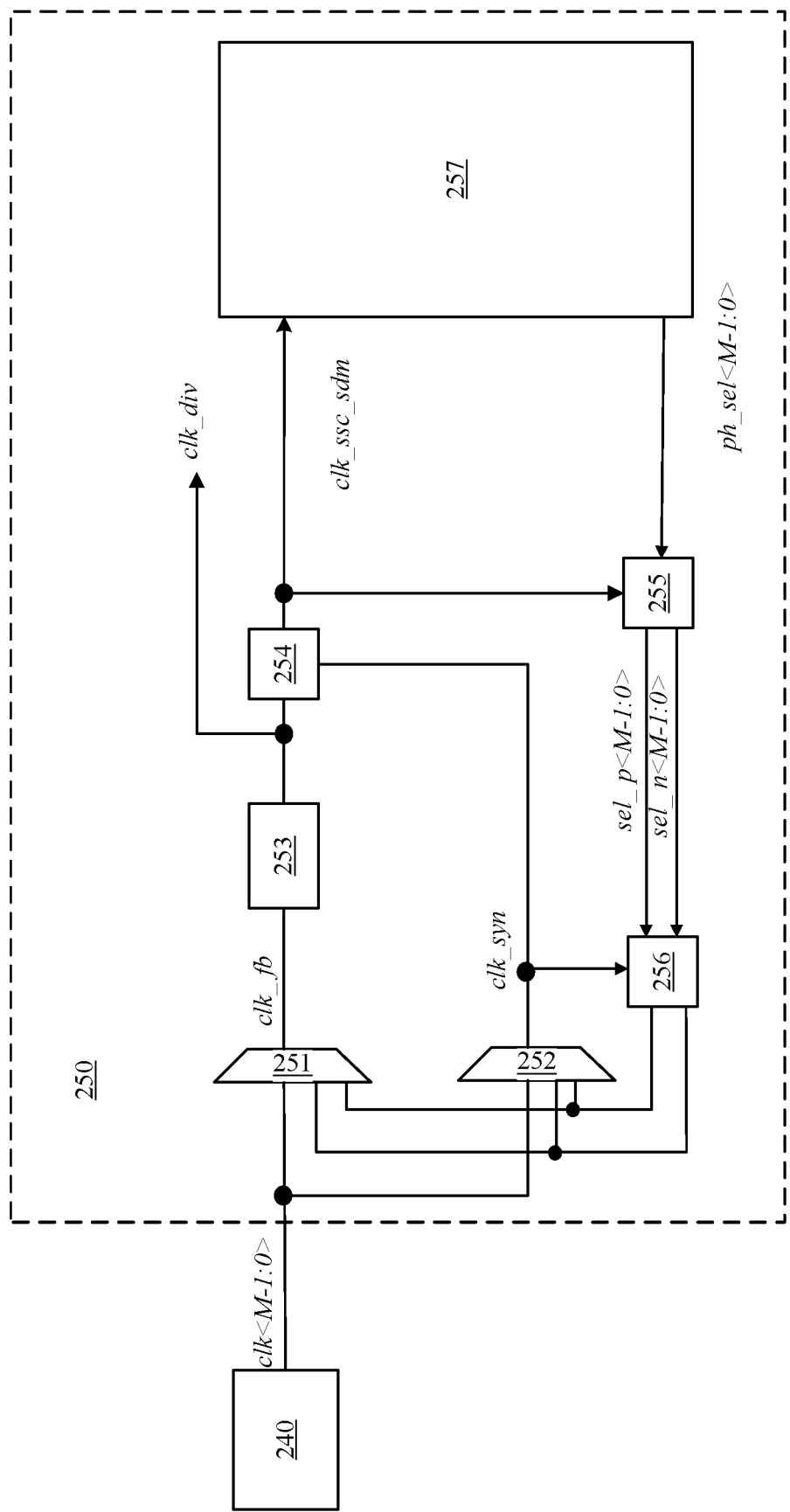
FIG. 4 shows a schematic diagram of a frequency dividing circuit according to a second embodiment of the present disclosure.
Figure 5:
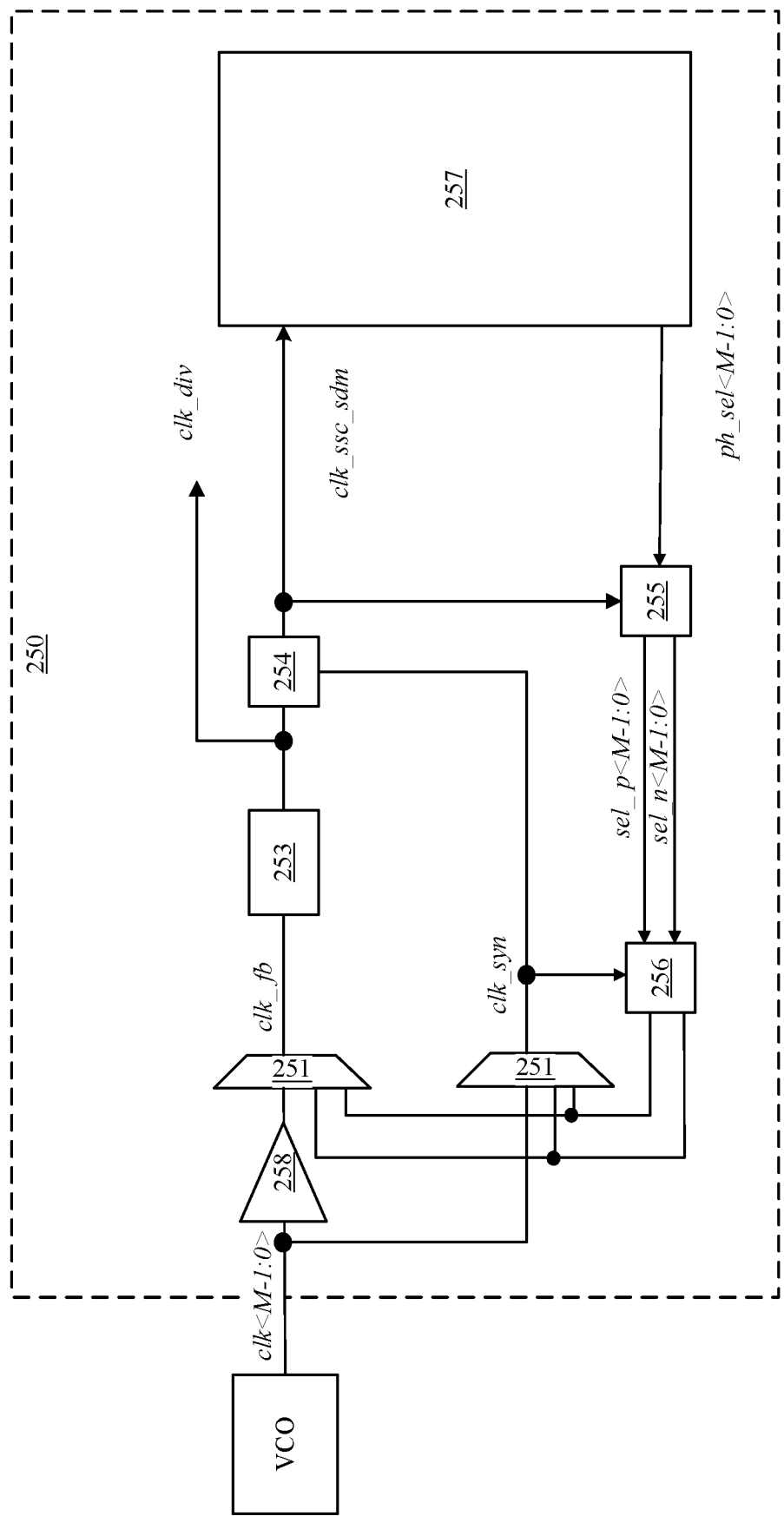
FIG. 5 shows a schematic diagram of a frequency dividing circuit according to a third embodiment of the present disclosure.

FIG. 3 shows a schematic diagram of a frequency dividing circuit according to a first embodiment of the present disclosure; FIG. 4 shows a schematic diagram of a frequency dividing circuit according to a second embodiment of the present disclosure; FIG. 5 shows a schematic diagram of a frequency dividing circuit according to a third embodiment of the present disclosure. According to the embodiments of the present disclosure, in order to increase the bandwidth of the phase locked loop 200, the inventor of the present application further improves the conventional frequency divider and provides a low noise frequency dividing circuit 250.

As shown in FIG. 3, the frequency dividing circuit 250 provided by the embodiments of the present disclosure comprises a clock selection unit 261, an integer frequency division unit 262, a trigger unit 263 and a switching signal unit 264. The clock selection unit 261 is configured to output any one of M clock signals as a first clock signal, and output a clock signal which lags behind the first clock signal by (½-1/M) of one cycle and is selected from the M clock signals as a second clock signal. The integer dividing unit 262 is configured to perform frequency division on the first clock signal so as to provide a frequency-divided clock signal clk_div. The trigger unit 263 is configured to trigger the frequency-divided clock signal clk_div according to the second clock signal to obtain a modulation clock signal, such that a switching edge of the modulation clock signal can be synchronized with a switching edge of the second clock signal, and a frequency of the modulation clock signal is the same as that of the frequency-divided clock signal clk_div. The switching signal unit 264 is configured to supply a switching signal to the clock selection unit 261 in accordance with the modulation clock signal and a preset target output frequency, wherein a switching edge of the switching signal is synchronized with a switching edge of the modulation clock signal, and the switching signal includes target phase selection information. Under a circumstance that the switching signal is received by the clock selection unit 261, the clock selection unit 261 is configured to select a third clock signal from another one of the M clock signals (different from said any one of M clock signals) and further output the third clock signal as the first clock signal since a switching edge of the switching signal according to the target phase selection information, thereby adjusting the frequency of the frequency-divided clock signal clk_div.

In the frequency dividing circuit 250 provided by the embodiments of the present disclosure, the frequency-divided clock signal clk_div, the modulation clock signal and the switching signal have the same frequency, and the second clock signal, the modulation clock signal and the switching signal have synchronizing switching edges, so that under a circumstance that the switching signal including the target phase selection information is received by the clock selection unit 261, the clock selection unit 261 is configured to select the third clock signal and further output the third clock signal as the first clock signal since a switching edge of the switching signal, thereby supporting the phase selection function of the frequency dividing circuit. The step width for frequency division is reduced to 1/M of one phase, and frequency adjustment is accomplished, that is, the frequency of the frequency-divided clock signal clk_div is adjusted according to the step width equal to 1/M of one cycle, so that the frequency $f_{out}$ of the clock signal output by the voltage-controlled oscillator 240 can reach the preset target output frequency. Such segmented adjustment can reduce quantization noise, thereby widening the bandwidth of the phase locked loop.

Specifically, referring to FIG. 4, the frequency dividing circuit 250 provided by an embodiment of the present disclosure comprises a first multiplexer 251, a second multiplexer 252, an integer frequency divider 253, a first flip-flop 254, and a modulator 257. The first multiplexer 251 and the second multiplexer 252 correspond to the above-described clock selection unit, the integer frequency divider 253 corresponds to the above-described integer frequency dividing unit, the first flip-flop 254 corresponds to the above-described trigger unit, and the modulator 257 corresponds to the above-described switching signal unit. The frequency dividing circuit 250 is configured to provide a frequency-divided clock signal clk_div having a target frequency (i.e., clock signal frequency $f_{out}$ shown in FIG. 2) according to a plurality of clock signals clk<M−1:0> including M clock signals, wherein adjacent clock signals among the M clock signals has a phase difference equal to 1/M of one cycle and each of the M clock signals has a same clock cycle $T_{clk\_vco}$. M is a positive integer greater than 2.

In this embodiment, the first multiplexer 251 is configured to provide a first clock signal clk_fb which is selected from any one of the M clock signals according to the plurality of clock signals clk<M−1:0>. The second multiplexer 252 is configured to provide a second clock signal clk_syn according to the plurality of clock signals clk<M−1:0>, wherein the second clock signal clk_syn lags behind the first clock signal clk_fb by (½-1/M) of one cycle. The integer frequency divider 253 is configured to perform frequency division on the first clock signal clk_fb to generate the frequency-divided clock signal clk_div, and the frequency dividing ratio N of the integer frequency divider 253 may be set, for example, to any integer from 40 to 80. The first flip-flop 254 is configured to provide the modulation clock signal clk_ssc_sdm in accordance with the frequency-divided clock signal clk_div and the second clock signal clk_syn, the first flip-flop 254 may be a rising edge-triggered synchronization flip-flop such that a rising edge of the modulation clock signal clk_ssc_sdm can be synchronized with a corresponding rising edge of the second clock signal clk_syn and the modulation clock signal clk_ssc_sdm can have the same frequency as the frequency-divided clock signal clk_div. The modulator 257 is configured to provide a switching signal ph_sel<M−1> in accordance with the modulation clock signal clk_ssc_sdm and provide the switching signal ph_sel<M−1:0> to at least the first multiplexer 251, so that the first multiplexer 251 can select the third clock signal from another one of the plurality of clock signals (different from said any one of M clock signals) and further output the third clock signal as the first clock signal clk_fb in accordance with the switching signal ph_sel<M−1:0>, thereby adjusting the frequency of the frequency-divided clock signal clk_div to the target frequency, that is, shifting the first clock signal clk_fb to the third clock signal, so that the frequency-divided clock signal clk_div may be changed corresponding to the signal shifting.

In the embodiment of the present disclosure, "selecting the third clock signal from another one of the plurality of clock signals clk<M−1:0> and further output the third clock signal as the first clock signal clk_fb" means that the first clock signal clk_fb is shifted from one of the plurality of clock signals clk<M−1:0> to another in one switching cycle of the switching signal.

As an example, a look-up table is stored in the modulator 257 and comprises one-to-one correspondence relations between target output frequency values and sets of register values MODMAX, each set of register values includes phase selection information. The look-up table is schematically shown in Table 1. According to the above-described look-up table and the preset target output frequency, the modulator 257 is configured to obtain the target phase selection information, and provide a switching signal ph_sel<M−1:0> in accordance with the modulation clock signal clk_ssc_sdm. The switching signal ph_sel<M−1:0> includes the target phase selection information and has the same frequency and a switching edge as the modulation clock signal clk_ssc_sdm, and the switching signal ph_sel<M−1:0> can control the third clock signal selected by the first multiplexer 251, so that the frequency-divided clock signal clk_div can be adjusted to have the target frequency.

TABLE 1

Look-up Table

| $f_{pll}$ (MHZ) | $f_{ref}$ (MHZ) | N | MODMAX |
|---|---|---|---|
| 1010 | 24 | 42 | 000101010101 |
| 1008 | 24 | 42 | 000000000000 |
| 1002.5 | 24 | 42 | 110001010110 |

In Table 1, $f_{pll}$ denotes the target output frequency, $f_{ref}$ denotes the frequency of the reference clock signal, N represents the frequency division ratio, and MODMAX denotes the register value including target phase selection information. The register value is a binary number converted from a value of $(f_{pll}/f_{ref}-N)*(2^n)$, where n denotes a bit number of MODMAX. In Table 1, the number of correspondence relation entries and the values of $f_{pll}$, $f_{ref}$ and N are exemplary and do not constitute a limitation to the present disclosure.

Optionally, the switching signal unit further comprises a second flip-flop 255 and a third flip-flop 256. The second flip-flop 255 is configured to convert the switching signal ph_sel<M−1:0> into a first switching signal sel_p<M−1:0> and a second switching signal sel_n<M−1:0> under control of the modulation clock signal clk_ssc_sdm, the first switching signal sel_p<M−1:0> and the second switching signal sel_n<M−1:0> are of opposite phase. The third flip-flop 256 is configured to provide the first switching signal sel_p<M−1:0> and the second switching signal sel_n<M−1:0> to the first multiplexer 251 according to the second clock signal clk_syn, and provide the first switching signal sel_p<M−1:0> and the second switching signal sel_n<M−1:0> to the second multiplexer 252, thereby controlling the states of the first clock signal clk_fb and the second clock signal clk_syn. In this embodiment, each of the first flip-flop 254, the second flip-flop 255 and the third flip-flop 256 may be realized by a rising edge-triggered synchronous flip-flop.

As an example, in order to achieve frequency division with an arbitrary fractional frequency division, the switching signal ph_sel<M−1:0> has a plurality of switching cycles, among which the third clock signal selected by the first multiplexer 251 may not be identical, meaning that the selected first clock signal clk_fb may not be identical in different switching cycles, so that the arbitrary fractional frequency can be achieved by averaging cycles. For example, in one switching cycle (40 ns), the first clock signal clk_fb is shifted from clock signal clk4 to clock signal clk3, and in the following two switching cycles, the first clock signal clk_fb is shifted from clock signal clk4 to clock signal clk5, so that an average cycle of the first clock signal clk_fb during the three switching cycles above is not an integer multiple of $(1/8*T_{clk\_vco})$. By averaging cycles, the frequency of the frequency-divided clock signal clk_div may include an arbitrary fractional portion, so that the frequency $f_{out}$ of the clock signal output by the voltage-controlled oscillator 240 may include an arbitrary fractional portion.

In another embodiment, the first clock signal clk_fb cannot be abruptly changed in an instant, that is, it takes a certain time to shift the first clock signal clk_fb, and the time required for shifting the first clock signal clk_fb is a sum of the time required for transmitting a signal in the first multiplexer 251, the second multiplexer 252 and the third flip-flop 256. Therefore, the first clock signal clk_fb selected by the first multiplexer 251 is required to be delayed. Referring to FIG. 5, the frequency dividing circuit 250 further comprises a delayer 258, through which the plurality of clock signals clk<M−1:0> are provided to the first multiplexer 251. The delayer 258 is configured to produce delay on the plurality of clock signals, wherein the delay lasts for a time longer than the time required for the shifting, thereby ensuring waveform accuracy of the shifted first clock signal clk_fb.

The present disclosure also provides a frequency dividing method, which can be applied to a frequency dividing circuit in the phase locked loop 200 to reduce noise, thereby improving the loop bandwidth of the phase locked loop 200.

The frequency dividing method is used for providing a frequency-divided clock signal according to a plurality of clock signals, the plurality of clock signals comprises M clock signals, a phase difference between each two adjacent clock signals is 1/M of one phase, where M is an integer greater than 2. Specifically, the frequency dividing method comprises: providing a first clock signal according to the plurality of clock signals, wherein the first clock signal is selected from any one of the M clock signals; providing a second clock signal according to the plurality of clock signals, wherein the second clock signal lags behind the first clock signal by (½−1/M) of one phase; performing frequency division on the first clock signal to generate a frequency-divided clock signal; providing a modulation clock signal according to the frequency-divided clock signal and the second clock signal; selecting a third clock signal from another one of the plurality of clock signals and further outputting the third clock signal as the first clock signal according to a switching signal, thereby adjusting a frequency of the frequency-divided clock signal.

Optionally, the frequency dividing method further comprises: converting the switching signal into a first switching signal and a second switching signal according to the modulation clock signal, wherein the first switching signal and the second switching signal are in opposite phase; under control of the second clock signal, controlling a state of the first clock signal according to the first switching signal and the second switching signal, and controlling a state of the second clock signal according to the first switching signal and the second switching signal.

Optionally, the frequency dividing method further comprises: before the first clock signal is output, controlling the plurality of clock signals to be delayed for a time longer than a time required for shifting the first clock signal, so as to ensure waveform accuracy of the shifted first clock signal.

Optionally, the switching signal has a plurality of switching cycles, the third clock signal selected in each one of the plurality of switching cycles may not be identical, so as to obtain an arbitrary fractional clock frequency ratio.

Figure 6:
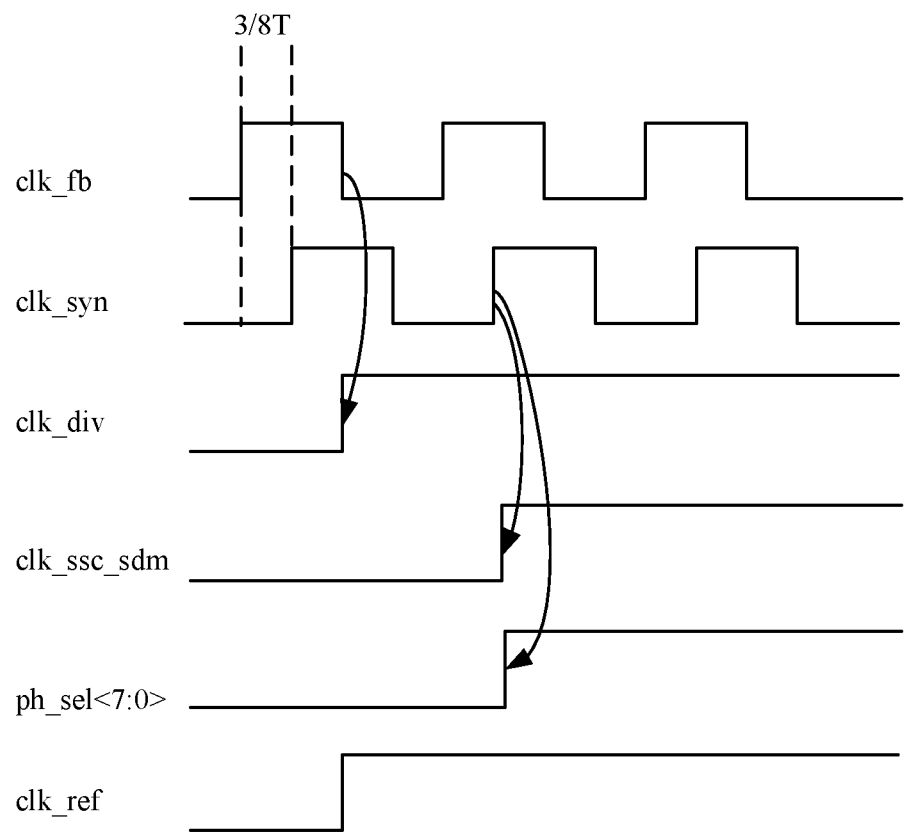
FIG. 6 shows a signal waveform diagram of the frequency dividing circuit according to the second embodiment of the present disclosure.
Figure 7:
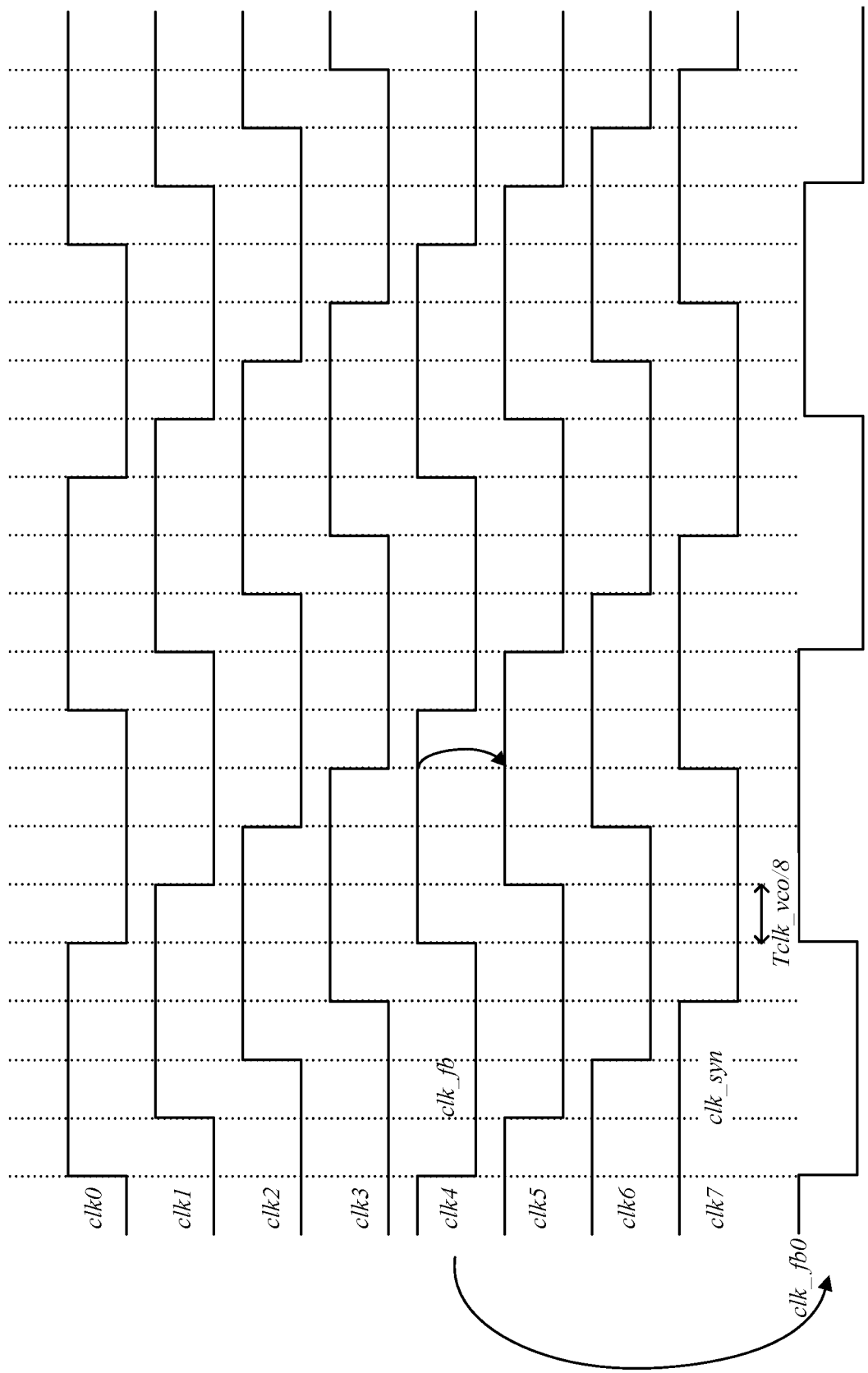
FIG. 7 shows an input and output waveform diagram of the frequency dividing circuit according to the second embodiment of the present disclosure.

FIG. 6 shows a signal waveform diagram of a frequency dividing circuit according to a second embodiment of the present disclosure; FIG. 7 shows an input and output waveform diagram of the frequency dividing circuit according to the second embodiment of the present disclosure. For the sake of clarity, as an example, the voltage-controlled oscillator provides 8 clock signals clk<7:0> as output clock signals, and transmitted the 8 clock signals clk<7:0> to the frequency dividing circuit.

In this example, the frequency dividing circuit is configured to select two clock signals from the 8 clock signals clk<7:0>, each of which has the same clock cycle equal to $T_{clk\_vco}$, wherein the clock signal clk<i+1> lags behind the clock signal clk<i> by $(1/8*T_{clk\_vco})$. Any one of the 8 clock signals clk<7:0> can be selected as the first clock signal clk_fb by the first multiplexer, and a clock signal which lags behind the first clock signal clk_fb by $3/8*T_{clk\_vco}$ in phase can be selected by the second multiplexer as the second clock signal clk_syn from the 8 clock signals clk<7:0>. The first clock signal clk_fb may change dynamically and the second clock signal clk_syn changes accordingly.

It is assumed that the frequency fret of the locally generated reference clock signal is 25 MHz, the frequency of each of the 8 clock signals clk<7:0> is 1 GHz, and the clock cycle $T_{clk\_vco}$ is 1 ns. Assuming that the first multiplexer selects clock signal clk4 as the first clock signal clk_fb, the second multiplexer selects clock signal clk7 as the second clock signal clk_syn, in which case the first clock signal clk_fb is clock signal clk4, the frequency of both the first clock signal clk_fb and the second clock signal clk_syn is 1 GHZ, and the clock cycle is 1 ns. The frequency dividing ratio N of the integer divider may be set, for example, to any integer from 40 to 80, and in this example, the frequency dividing ratio N is set to 40 for convenience of explanation. The frequency of the first clock signal clk_fb is divided by the integer frequency divider, so that a frequency-divided clock signal clk_div can be obtained to have a frequency of 25 Mhz and a clock cycle of 40 ns.

The first flip-flop is configured to receive the frequency-divided clock signal clk_div and the second clock signal clk_syn, and output a modulation clock signal clk_ssc_sdm having a same frequency and a different phase with the frequency-divided clock signal clk_div at a first rising edge of the second clock signal clk_syn. The phase difference between the frequency-divided clock signal clk_div and the modulation clock signal clk_ssc_sdm is at least $(7/8*T_{clk\_vco})$, wherein $(7/8*T_{clk\_vco})=(3/8+1/2) T_{clk\_vco}$. After receiving the modulation clock signal clk_ssc_sdm, the modulator is configured to convert the modulation clock signal clk_ssc_sdm into a switching signal ph_sel<7:0>. In this example, as shown in FIG. 6, the function of the first flip-flop is to synchronize a rising edge provided by the modulation clock signal clk_ssc_sdm of the modulator with a corresponding rising edge of the second clock signal clk_syn, that is, to synchronize the switching signal ph_sel<m-1:0> and the second clock signal clk_syn.

The second flip-flop is configured to receive the switching signal ph_sel<7:0> and the modulation clock signal clk_ssc_sdm, and output a signal having the same frequency as the frequency-divided clock signal clk_div, which has a frequency of 25 MHz and a clock cycle of 40 ns. Because of signal requirements for controlling the first multiplexer and the second multiplexer, the second flip-flop converts the switching signal ph_sel<7:0> into a first switching signal sel_p<7:0> having a same phase as ph_sel<7:0>, and a second switching signal sel_n<7:0> having an opposite phase with the switching signal ph_sel<7:0>.

A third flip-flop is configured to receive the second clock signal clk_syn, input the first switching signal sel_p<7:0> and the second switching signal sel_n<7:0> to the first multiplexer at a first rising edge in a clock cycle of the switching signal of 25 MHz, and input the first switching signal sel_p<7:0> and the second switching signal sel_n<7:0> to the second multiplexer (in fact, the first switching signal sel_p<7:0> and the second switching signal sel_n<7:0> are input at each rising edge of the second clock signal clk_syn within the clock cycle of 40 ns, however, the first switching signal sel_p<7:0> and the second switching signal sel_n<7:0> do not change during that 40 ns, thus only the input at the first rising edge of the second clock signal clk_syn is valid), so as to shift the first clock signal clk_fb from clk4 to a third clock signal selected from clk<7:0>, thus the frequency-divided clock signal clk_div may be changed corresponding to the shifting, so that the output frequency of the voltage-controlled oscillator may be changed into a target output frequency.

In this embodiment, the function of the second flip-flop and the third flip-flop is to optimize timing and ensure that the phase selection function works correctly.

As shown in FIG. 7, if the target output frequency of the PLL is greater than 1 GHz, the third clock signal lags behind the clock signal clk4 by corresponding phase (the modulator 257 is configured to select the third clock signal through calculation, that is, to select another clock signal as the third clock signal which is a target clock signal for the first clock signal clk_fb to be shifted to, so that the frequency-divided clock signal clk_div can be adjusted to the target frequency, which ensures that the output frequency of the voltage-controlled oscillator can be adjusted to the target output frequency), as shown in FIG. 7, for example, the first clock signal clk_fb is shifted to clk5, and the first clock signal having a signal waveform as shown by clk_fb0, the clock cycle of the first clock signal clk_fb0 becomes longer and the frequency becomes lower, the frequency of the frequency-divided clock signal clk_div may be reduced from 25 Mhz, the phase detector 210 may judge that the frequency of the frequency-divided clock signal clk_div is lower than the frequency fret of the reference clock signal, the output signal frequency of the voltage-controlled oscillator may be increased by the phase locked loop to a target output frequency; and vice versa.

In the above-described embodiment, the clock cycle of the first clock signal clk_fb is an integer multiple of ⅛ $T_{clk\_vco}$. In an alternative embodiment, the target output frequency having an arbitrary fractional portion can be realized by averaging cycles. For example, the first clock signal clk_fb is shifted from clock signal clk4 to clock signal clk3 in one switching period (40 ns), the first clock signal clk_fb is shifted from clock signal clk4 to clock signal clk5 in the following two switching cycles, and an average cycle of the first clock signal clk_fb is not an integer multiple of ⅛ $T_{clk\_vco}$ during the above-mentioned three switching cycles.

According to the embodiments of the present disclosure, the frequency dividing circuit has phase selection function, the step width of frequency division is reduced to 1/M, and frequency adjustment is realized by use of shifting the first clock signal, so that quantization noise of the frequency dividing circuit can be reduced, the bandwidth of the phase locked loop can thereby widened, which brings many advantages, for instance, the bandwidth of the phase locked loop can be widened, the locking time of the phase locked loop can be shortened, the phase noise near the output signal frequency of the voltage-controlled oscillator can be reduced, and the required filter area can be reduced, that is, the filter area can be made smaller, so that the area occupied by phase locked loop can be reduced.

It should be noted that, relational terms such as "first" and "second", etc., are used herein only to distinguish one entity or operation from another, and do not necessarily require or imply any such actual relationship or order between these entities or operations. Moreover, the terms "comprising", "including" or any other variation thereof are intended to encompass non-exclusive inclusion, so that a process, method, article or equipment that includes a set of elements may not only comprise those elements but also other elements that are not explicitly listed or are inherent to such a process, method, article or equipment. In the absence of more restrictions, the statement "comprising a . . . " for defining an element does not preclude an existence of another identical element in the process, method, article or equipment that includes the said element.

In accordance with the above-described embodiments of the present disclosure, the embodiments are not exhaustively described in all detail, nor are the present disclosure limited to the specific embodiments described herein. Obviously, according to the above description, many modifications and changes can be made. These embodiments are selected and specifically described in this specification in order to better explain the principles and practical applications of the present disclosure, thereby enabling those skilled in the art to make good use of the present invention and modifications based on the disclosure. The invention is limited only by the claims and their full scope and equivalents.

What is claimed is:

1. A frequency dividing circuit, configured to provide a frequency-divided clock signal according to a plurality of clock signals including M clock signals, wherein M is an integer greater than 2, a phase difference between each two adjacent ones of the M clock signals is 1/M of one phase, and the frequency dividing circuit comprises:
    a clock selection unit, configured to output any one of the M clock signals as a first clock signal and output a clock signal that lags behind the first clock signal by (½-1/M) of one phase and is selected from the M clock signals as a second clock signal;
    an integer frequency dividing unit, configured to perform frequency division on the first clock signal to generate the frequency-divided clock signal;
    a trigger unit, configured to trigger the frequency-divided clock signal according to the second clock signal to obtain a modulation clock signal, so as to synchronize a switching edge of the modulation clock signal with a switching edge of the second clock signal;
    a switching signal unit, configured to supply a switching signal to the clock selection unit in accordance with the modulation clock signal and a preset target output frequency, wherein a switching edge of the switching signal is synchronized with a switching edge of the modulation clock signal, and the switching signal includes target phase selection information; and
    the clock selection unit, configured to select a third clock signal from another one of the M clock signals and further output the third clock signal as the first clock signal since a switching edge of the switching signal according to the target phase selection information, thereby adjusting a frequency of the frequency-divided clock signal.

2. The frequency dividing circuit according to claim 1, wherein the clock selection unit comprises:
    a first multiplexer, configured to output said any one of the M clock signals as the first clock signal, and select to further output the third clock signal as the first clock signal since a switching edge of the switching signal according to the target phase selection information in case that the switching signal is received;
    a second multiplexer, configured to output one of the M clock signals, which lags behind the first clock signal by (½-1/M) of one phase, as a second clock signal.

3. The frequency dividing circuit according to claim 1, wherein the trigger unit comprises: a first flip-flop, configured to trigger the frequency-divided clock signal according to the second clock signal to obtain the modulation clock signal, which has a same frequency with the frequency-divided clock signal.

4. The frequency dividing circuit according to claim 1, wherein the switching signal unit comprises a modulator, configured to obtain the target phase selection information according to the preset target output frequency and one-to-one correspondence relations between target output frequency values and sets of register values provided in a pre-stored look-up table, wherein each of the sets of register values includes phase selection information.

5. The frequency dividing circuit according to claim 2, wherein the switching signal unit further comprises:
    a second flip-flop, configured to convert the switching signal into a first switching signal and a second switching signal according to the modulation clock signal, wherein the first switching signal has an opposite phase to the second switching signal; and
    a third flip-flop, configured to trigger the first switching signal and the second switching signal according to the second clock signal, provide the first switching signal and the second switching signal to the first multiplexer to adjust a state of the first clock signal, and provide the first switching signal and the second switching signal to the second multiplexer to adjust a state of the second clock signal.

6. The frequency dividing circuit of claim 2, wherein the clock selection unit further comprises: a delayer, through which the plurality of clock signals are coupled to the first multiplexer, wherein the delayer is configured to produce delay on the plurality of clock signals.

7. The frequency dividing circuit according to claim 1, wherein the switching signal has a plurality of switching cycles, the third clock signal selected by the clock selection unit in each one of the plurality of switching cycles is not identical, such that an average cycle of the first clock signal is not an integer multiple of (Tclk_vco/M) in the plurality of switching cycles, where Tclk_vco represents a clock cycle of the plurality of clock signals.

8. A frequency dividing method, used for providing a frequency-divided clock signal according to a plurality of clock signals, which includes M clock signals, wherein M is an integer greater than 2, and a phase difference between each two adjacent ones of the M clock signals is 1/M of one phase, the frequency dividing method comprises:

- outputting any one of the M clock signals as a first clock signal, and outputting a clock signal, which lags behind the first clock signal by (½-1/M) of one phase and is selected from the M clock signals as a second clock signal;
- performing frequency division on the first clock signal to generate the frequency-divided clock signal;
- triggering the frequency-divided clock signal according to the second clock signal to obtain a modulation clock signal, so as to synchronize a switching edge of the modulation clock signal with a switching edge of the second clock signal;
- providing a switching signal according to the modulation clock signal and a preset target output frequency, wherein a switching edge of the switching signal is synchronized with a switching edge of the modulation clock signal, and the switching signal includes target phase selection information; and
- selecting a third clock signal from another one of the M clock signals according to the target phase selection information, and further outputting the third clock signal as the first clock signal since a switching edge of the switching signal, thereby adjusting a frequency of the frequency-divided clock signal.

9. The frequency dividing method according to claim 8, wherein the step of providing the switching signal according to the modulation clock signal and the preset target output frequency comprises:

- obtaining the target phase selection information according to the preset target output frequency and one-to-one correspondence relations between target output frequency values and sets of register values provided in a pre-stored look-up table, and providing a switching signal including the target phase selection information, wherein each one of the sets of register values includes phase selection information.

10. A phase locked loop, comprising:

- a phase detector, configured to compare a reference clock signal with a frequency-divided clock signal to generate a phase error signal;
- a charge pump and a low-pass filter, wherein the phase error signal is configured to control current inflow and outflow of the charge pump to the low-pass filter, thereby adjusting an output voltage of the low-pass filter;
- a voltage-controlled oscillator configured to generate an output clock signal according to the output voltage; and
- the frequency dividing circuit according to claim 1, which is configured to obtain the frequency-divided clock signal by dividing a frequency of the output clock signal.

* * * * *